(12) United States Patent
Hsu et al.

(10) Patent No.: US 7,719,104 B2
(45) Date of Patent: May 18, 2010

(54) CIRCUIT BOARD STRUCTURE WITH EMBEDDED SEMICONDUCTOR CHIP AND METHOD FOR FABRICATING THE SAME

(75) Inventors: Shih-Ping Hsu, Hsin-chu (TW); Shang-Wei Chen, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 63 days.

(21) Appl. No.: 11/868,010

(22) Filed: Oct. 5, 2007

(65) Prior Publication Data
US 2008/0116565 A1    May 22, 2008

(30) Foreign Application Priority Data
Nov. 21, 2006    (TW) ............... 95142947 A

(51) Int. Cl.
*H01L 23/04* (2006.01)
(52) U.S. Cl. ............. 257/699; 257/700; 257/701; 257/E23.006; 438/121
(58) Field of Classification Search ......... 257/699, 257/E23.006, E21.597, 698, 700–702
See application file for complete search history.

(56) References Cited

U.S. PATENT DOCUMENTS 6,351,031 B1 *  2/2002  Iijima et al. ............ 257/698
2003/0015342 A1 *  1/2003  Sakamoto et al. ....... 174/250

* cited by examiner

*Primary Examiner*—Thinh T Nguyen
(74) *Attorney, Agent, or Firm*—Sawyer Law Group, P.C.

(57) ABSTRACT

The present invention provides a circuit board structure with an embedded semiconductor chip and a method for fabricating the same. The circuit board structure includes a carrier board having a first surface, a second surface, and a through hole penetrating the carrier board from the first surface to the second surface; a semiconductor chip having an active surface whereon a plurality of electrode pads are formed and a non-active surface, embedded in the through hole; a photosensitive first dielectric layer formed on the first surface of the carrier board and an opening formed thereon to expose the non-active surface of the semiconductor chip; a photosensitive second dielectric layer formed on the second surface of the carrier board and the active surface of the semiconductor chip.

11 Claims, 3 Drawing Sheets

CIRCUIT BOARD STRUCTURE WITH EMBEDDED SEMICONDUCTOR CHIP AND METHOD FOR FABRICATING THE SAME

CROSS-REFERENCE TO RELATED APPLICATIONS

Under 35 U.S.C. §119(e), this application claims the benefit of priority to Taiwanese Patent Application No. 095142947, filed Nov. 21, 2006. All of which is incorporated herein by reference.

BACKGROUND OF THE INVENTION

1. Field of the Invention

The present invention relates to circuit board structures and a method for fabricating the same, and more particularly, to a circuit board structure with a semiconductor chip embedded therein and a method for fabricating the same.

2. Description of the Prior Art

As the semiconductor package technology continues to evolve, many different types of semiconductor devices have been developed. Fabrication of a semiconductor package comprises the steps of mounting a semiconductor chip on a package substrate or a lead frame, electrically connecting the semiconductor chip to the package substrate or the lead frame, and performing an encapsulation process using an encapsulant. Among these different types of semiconductor devices, a ball grid array (BGA) package represents advanced semiconductor package technology, which features utilizing a package substrate with a plurality of solder balls aligned in grid array and formed on the back surface of the package substrate for electrically connecting a semiconductor chip to external devices, such that more I/O connections can be accommodated within the same unit area of a surface of the semiconductor chip carrier so as to cater for the high-integration semiconductor chip.

In the traditional semiconductor package, the semiconductor chip is attached to the top surface of the substrate and undergoes wire bonding packaging or connected with a flip chip packaging, then the back surface of the substrate is implanted with a plurality of solder balls for electrical connection with the semiconductor chip, thus achieving a high pin number. But the undesirably long connection path of the bonding wires may bring about increased impedance, thereby making it difficult to enhance the electrical performance during high-frequency use or high-speed operation. Moreover, traditional packages require connecting an interface repeatedly which undesirably increase the fabricating cost.

In order to effectively enhance the electrical performance to meet the requirement for applications of the next generation electronic devices, the semiconductor package industry is devoted to the research in embedding a semiconductor chip in the carrier board for establishing direct electrical connection in order to reduce the length of the electrical transmission pathway as well as reduce signal loss and signal distortion, thereby improving high-speed operation.

FIG. 1 shows a cross-sectional schematic view of a conventional semiconductor package in which a semiconductor element is embedded in a substrate. A method for fabricating the conventional semiconductor package with an embedded semiconductor element comprises: preparing a carrier board 10 having a first surface 101 and an opposing second surface 102; forming at least one through hole 100 penetrating the carrier board 10 from the first surface 101 to the second surface 102 of the carrier board 10; receiving a semiconductor chip 11 in the through hole 100 and securing the semiconductor chip 11 to the through hole 100 by a glue material 110, wherein the semiconductor chip 11 has an active surface 11a and a non-active surface 11b opposing the active surface 11a, the active surface 11a having a plurality of electrode pads 111 formed thereon; forming a circuit build up structure 12 on the first surface 101 of the carrier board 10 and the active surface 11a of the semiconductor chip 11, wherein the circuit build up structure 12 further comprises a dielectric layer 120, a circuit layer 121 stacked on the dielectric layer 120, and conductive vias 122 formed in the dielectric layer 120 and electrically connected to the electrode pads 111 of the semiconductor chip 11.

Although the foregoing chip-embedded semiconductor package can solve various drawbacks of the prior art, the foregoing circuit build up structure 12 is formed on a single surface, that is, the first surface 101 of the carrier board 10, thus resulting in asymmetry of the circuit board in terms of structure. The structural asymmetry is accompanied by unbalanced thermal stress during a fabrication process that features an increasing number of circuit layers, and variation of temperature during, for example, substrate baking, and a thermal cycle. The unbalanced thermal stress tends to cause problems, such as warpage of the substrate structure, inter-layer delamination, and even chip cracking.

Thus, there is an urgent need for developing a chip-embedded semiconductor package to overcome drawbacks of the prior art, such as warpage and high production cost.

SUMMARY OF THE INVENTION

In light of the foregoing drawbacks of the prior art, a primary objective of the present invention is to provide a circuit board structure with an embedded semiconductor chip and a fabricating method thereof for preventing warpage of the semiconductor package due to heat treatment.

Another objective of the invention is to provide a circuit board structure with an embedded semiconductor chip and a fabricating method thereof for preventing chip damage as a result of warpage of the semiconductor package.

In order to achieve the foregoing and other objectives, the circuit board structure with an embedded semiconductor chip comprises: a carrier board having a first surface, second surface and at least one through hole penetrating the carrier board from the first surface to the second surface; a semiconductor chip, having an active and a non-active surface, embedded in the through hole, with a plurality of electrode pads formed on the active surface; at least one first dielectric layer made of a photosensitive material, formed on the first surface of the carrier board, and formed with an opening to expose the non-active surface of the semiconductor chip; at least one second dielectric layer made of a photosensitive material, formed on the second surface of the carrier board and the active surface of the chip, and formed with a plurality of openings to expose the electrode pads on the semiconductor chip; and a circuit layer formed on the second dielectric layer and electrically connected to the electrode pads on the semiconductor chip via the conductive structures in the openings of the second dielectric layer.

Based on the foregoing structure, a fabricating method of the circuit board structure with an embedded semiconductor chip comprises the steps of: providing a carrier board having a first surface, second surface and a through hole penetrating the carrier board from the first surface to the second surface; receiving in the through hole a semiconductor chip having an active surface with a plurality of electrode pads formed thereon and a non-active surface; forming at least one photosensitive first dielectric layer on the first surface of the carrier board, wherein an opening is formed in the first dielectric layer to expose the non-active surface of the semiconductor chip; forming a photosensitive second dielectric layer on the second surface of the carrier board and the active surface of the semiconductor chip, wherein a plurality of openings are formed in the second dielectric layer to expose the plurality of electrode pads on the semiconductor chip; and forming a circuit layer on the second dielectric layer, wherein the circuit layer is electrically connected to the electrode pads on the semiconductor chip via the conductive structures in the openings of the second dielectric layer.

In this embodiment of the present invention, the carrier board comprises at least two core layers interposed with an adhesive layer, such that the gap between the semiconductor chip and the through hole of the carrier board is filled with the adhesive layer upon pressing the core layers, and thus the semiconductor chip is secured in position.

According to the foregoing structure and fabricating method, a circuit build up structure can be further formed on the second dielectric layer and circuit layer. The circuit build up structure comprises a dielectric layer, a circuit layer stacked on the dielectric layer, and conductive structures formed in the dielectric layer for electrical connection with the circuit layer. Moreover, the outer surface of the circuit build up structure is formed with a plurality of electrical connection pads and covered with a solder mask layer. The solder mask layer has a plurality of openings for exposing the electrical connection pads on the outer surface of the circuit build up structure. Furthermore, conductive elements are formed on the electrical connection pads which are exposed from the openings of the solder mask layer.

Besides, the thickness of the first dielectric layer of the first surface of the carrier board is modified according to the electrical connection pads on the outer surface of the circuit build up structure. Furthermore, conductive elements are formed on the electrical connection pads which are exposed from the openings of the solder mask layer.

In addition, the number of the first dielectric layers on the first surface of the carrier board is modified according to the number of circuit build up layers of the circuit build up structure, so as to eliminate unbalanced thermal stress which might otherwise arise from temperature variation during heat treatment, and thus preventing the occurrence of warpage.

Accordingly, the circuit board with an embedded semiconductor chip and the fabricating method thereof provided by the present invention mainly involve forming a first dielectric layer on the first surface of the carrier board at the same time as the circuit build up process is performed on the second surface of the carrier board, so as to eliminate the thermal stress of the circuit build up layers. The first dielectric layer eliminates unbalanced thermal stress of the circuit build up layers associated with temperature variation during the fabricating processes, such that the problem of warpage can be prevented. Moreover, the circuit board structure formed by pressing upon the dielectric layers can also prevent bending of the circuit board, and thus the semiconductor chip embedded in the through hole of the carrier board is protected against damage.

BRIEF DESCRIPTION OF THE DRAWINGS

The present invention can be more fully understood by reading the following detailed description of the preferred embodiment, with reference made to the accompanying drawings, wherein.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

Referring to FIGS. 2A-2F, cross-sectional schematic views of a circuit board with an embedded semiconductor chip are shown.

Figure 1:
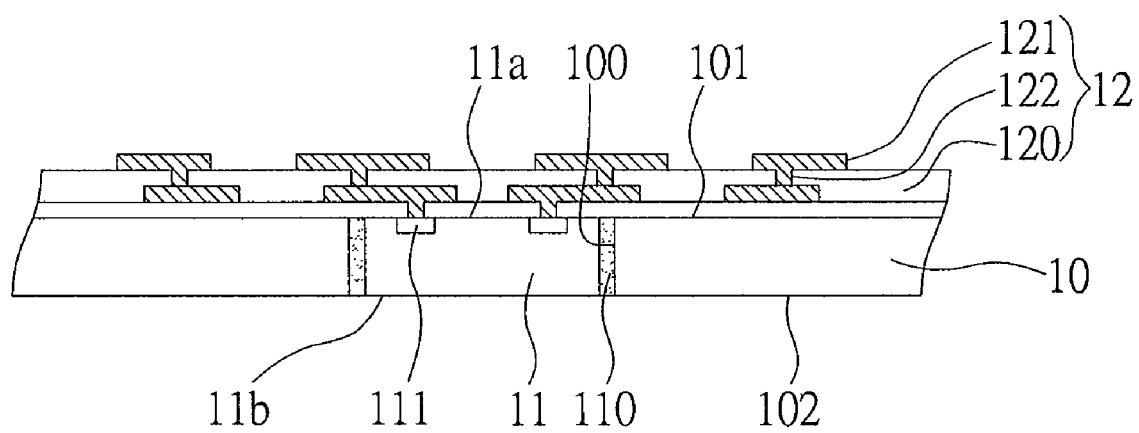
FIG. 1 is a cross-sectional schematic view of a conventional package structure with an embedded semiconductor chip.
Figure 2A:
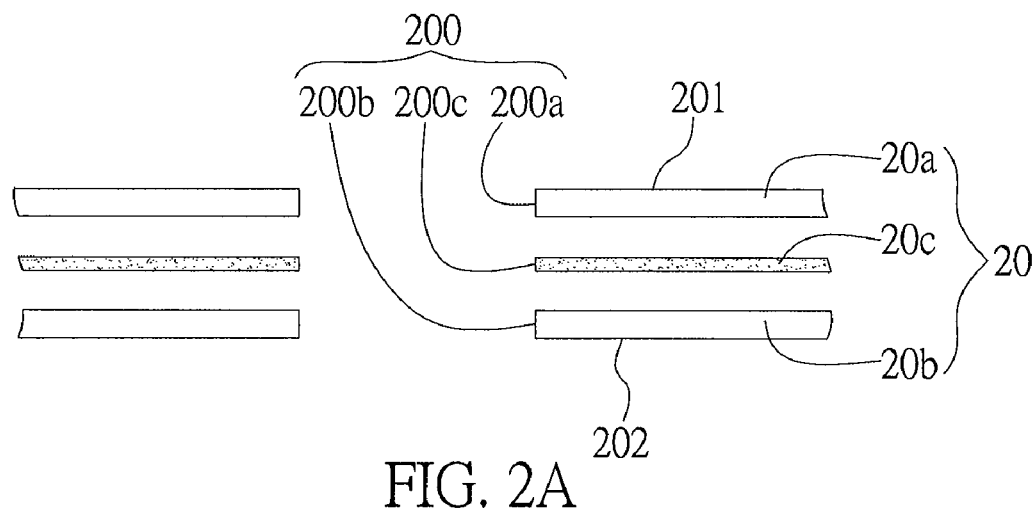
FIGS. 2A-2F are cross-sectional schematic views of a circuit board with an embedded semiconductor chip and the fabricating method thereof of the present invention.

As shown in FIG. 2A, a carrier board 20 having a first surface 201 and a second surface 202 is provided. In this embodiment, the carrier board 20 comprises at least two core layers 20a, 20b and an adhesive layer 20c, and the core layers 20a, 20b and the adhesive layer 20c are formed with openings 200a, 200b, 200c respectively. The adhesive layer 20c is interposed between the two core layers 20a and 20b in such a way that a through hole 200 penetrating the core layers 20a, 20b and the adhesive layer 20c is formed. The outer surfaces of the core layers 20a and 20b are the first surface 201 and second surface 202 of the carrier board respectively. The core layers 20a, 20b are circuit boards, insulating boards, or metallic boards.

Figure 2B:
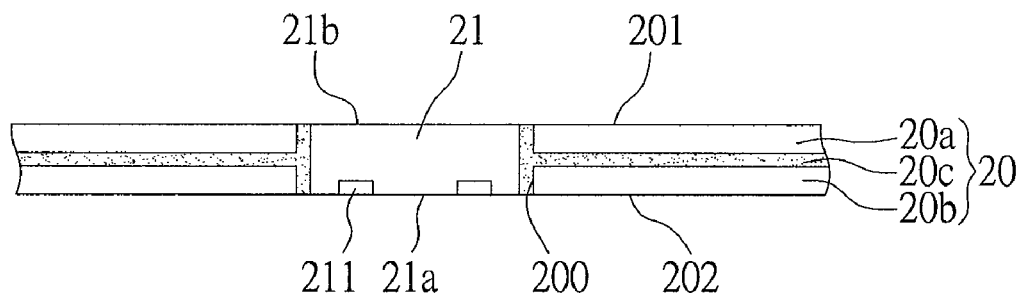

As shown in FIG. 2B, a semiconductor chip is embedded in the through hole 200. The semiconductor chip 21 has an active surface 21a and an opposing non-active surface 21b. A plurality of electrode pads 211 are formed on the active surface 21a. Pressing the upper and lower surfaces of the carrier board 20 allows the adhesive layer 20c to fill the gap between the through hole 200 and the semiconductor chip 21, and thus the semiconductor chip 21 is firmly secured to the through hole 200. The active surface 21a of the semiconductor chip 21 can be on the same plane as the second surface 202 of the carrier board 20 or on the same place as the first surface 201.

Figure 2C:
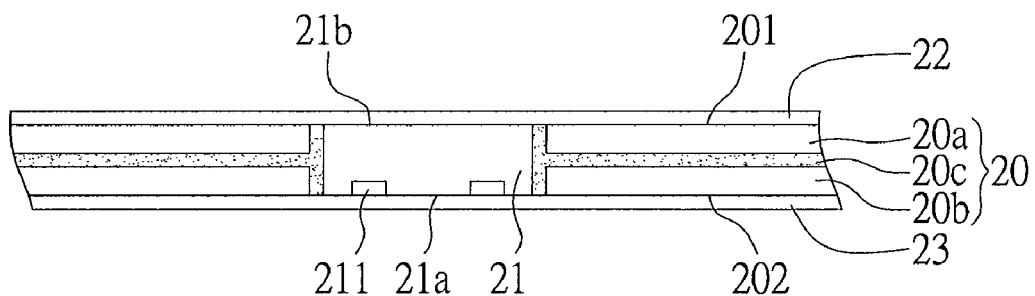

As shown in FIG. 2C, at least one first dielectric layer 22 with photosensitivity is formed on the first surface 201 of the carrier board 20 and on the non-active surface 21b of the semiconductor chip 21. A second dielectric layer 23 with photosensitivity is formed on the second surface 202 of the carrier board 20 and on the active surface 21a of the semiconductor chip 21.

Figure 2D:
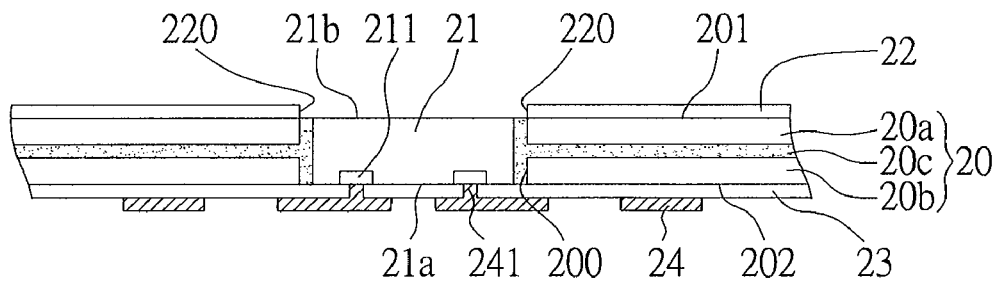

As shown in FIG. 2D, after exposure and development processes, an opening 220 is formed in the first dielectric layer 22 to expose the non-active surface 21b of the semiconductor chip 21 and a plurality of openings are formed in the second dielectric layer 23 to expose the electrode pads 211 on the semiconductor chip 21. Subsequently, a circuit layer 24 is formed on the surface of the second dielectric layer 23. The circuit layer 24 is electrically connected to the electrode pads 211 on the semiconductor chip 21 via at least one conductive structure 241 in the openings of the second dielectric layer 23.

Figure 2E:
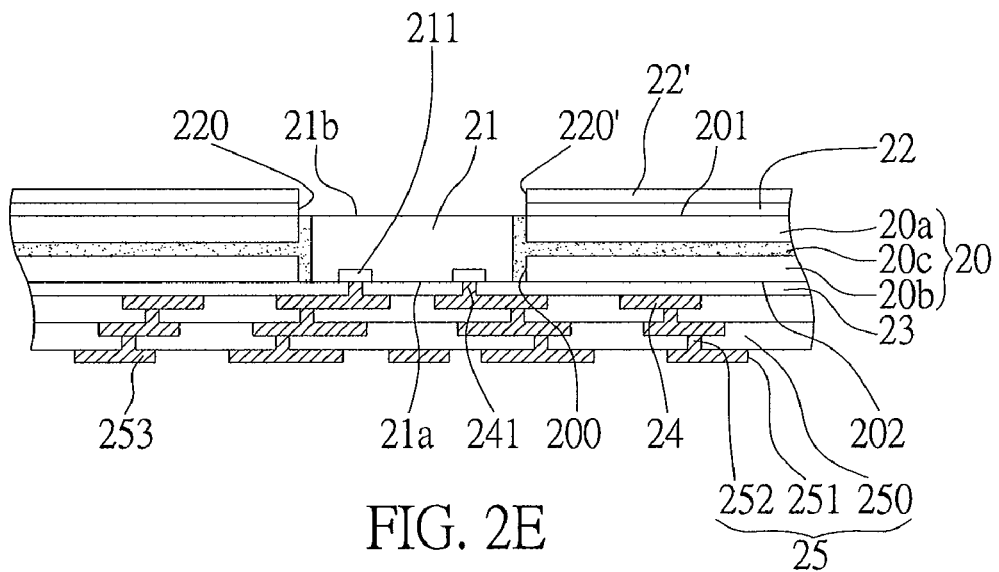

As shown in FIG. 2E, a circuit build up process is performed on the second dielectric layer 23 and the circuit layer 24 to form a circuit build up structure 25. Meanwhile, at least one first dielectric layer 22' is further formed on the surface of the first dielectric layer 22 on the first surface 201 of the carrier board 20 and in a similar manner an opening 220' is formed in the first dielectric layer 22' after exposure and development processes to expose the non-active surface 21b of the semiconductor chip 21, allowing the non-active surface 21b of the semiconductor chip 21 to be exposed for the sake of heat dissipation. The presence of the plurality of first dielectric layers 22, 22' prevents warpage which might otherwise occur because of the thermal stress resulting from an increased number of circuit build up layers and dielectric layers.

The circuit build up structure 25 comprises a dielectric layer 250, a circuit layer 251 stacked on the surface of the dielectric layer 250, and conductive structures 252 formed in the dielectric layer 250. Furthermore, a plurality of electrical connection pads 253 are formed on the outer surface of the circuit build up structure 25.

Accordingly, to prevent the circuit build up structure from bending and deformation due to temperature variation and an increased number of circuit build up layers, at least another first dielectric layer 22' is formed on the first surface 201 of the carrier board 20, so as to prevent warpage. The number of the first dielectric layers 22, 22' depends on the number of circuit build up layers of the circuit build up structure 25 (but an increased number of first dielectric layers does not necessarily equal the number of dielectric layers in the circuit build up structure), so as to prevent warpage which might otherwise arise from a one-sided build up process.

Figure 2F:
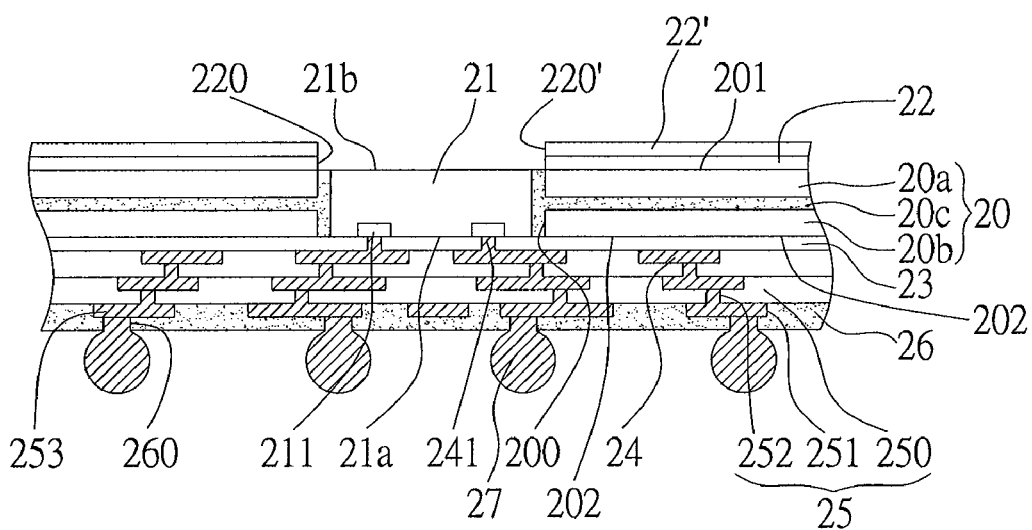

As shown in FIG. 2F, a solder mask layer 26 covers the outer surface of the circuit build up structure 25. The solder mask layer 26 is formed with a plurality of openings 260 to expose the electrical connection pads 253 on the outer surface of the circuit build up structure 25. Conductive elements 27, such as solder balls, pins, and metal lands, are implanted on the electrical connection pads 253, allowing the semiconductor chip embedded in the carrier board to be electrically connected to an external device directly.

According to the foregoing fabricating method, the circuit board with an embedded semiconductor chip provided by the present invention comprises: a carrier board 20 having a first surface 201, a second surface 202, and at least one through hole 200 penetrating the carrier board 20 from the first surface 201 to the second surface 202; a semiconductor chip 21, having an active surface 21a and a non-active surface 21b, embedded in the through hole 200, with a plurality of electrode pads 211 formed on the active surface 21a; a first dielectric layer 22 made of a material with photosensitivity, formed on the first surface 201 of the carrier board 20, and formed with an opening 220 to expose the non-active surface 21b of the semiconductor chip 21; a second dielectric layer 23 made of a material with photosensitivity, formed on the second surface 202 of the carrier board 20 and the active surface 21a of the semiconductor chip 21, and formed with a plurality of openings to expose the electrode pads on the semiconductor chip 21; and a circuit layer 24 formed on the second dielectric layer 23 and electrically connected to the electrode pads 211 on the semiconductor chip 21 via the conductive structures 241 in the openings of the second dielectric layer 23.

The circuit board structure with an embedded semiconductor chip in the present invention further comprises a circuit build up structure 25 formed on the surface of the second dielectric layer 23 and the circuit layer 24. The circuit build up structure 25 comprises a dielectric layer 250, a circuit layer 251 stacked on the dielectric layer 250, and conductive structures 252 formed in the dielectric layer 250. Moreover, the outer surface of the circuit build up structure 252 is formed with a plurality of electrical connection pads 253 and covered with a solder mask layer 26. The solder mask layer 26 has a plurality of openings 260 for exposing the electrical connection pads 253. Furthermore, conductive elements 27 are formed on the electrical connection pads 253, thus allowing the semiconductor chip embedded in the carrier board to be electrically connected to an external electronic device.

Accordingly, the circuit board with an embedded semiconductor chip and the fabricating method thereof provided by the present invention mainly involve forming a first dielectric layer on the first surface of the carrier board while performing a circuit build up process on the second surface of the carrier board, so as to reduce thermal stress of the circuit build up layers. The first dielectric layer eliminates unbalanced thermal stress of the circuit build up layers associated with temperature variation in the fabricating processes, thus preventing warpage. Moreover, the circuit board structure with pressed dielectric layers can also prevent bending of the circuit board, thus protecting the semiconductor chip embedded in the through hole of the carrier board against damage.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board structure with an embedded semiconductor chip, comprising:
    a carrier board having a first surface, a second surface, and at least one through hole penetrating the carrier board from the first surface to the second surface;
    a semiconductor chip having an active surface whereon a plurality of electrode pads are formed and a non-active surface, embedded in the through hole;
    at least one first dielectric layer made of a photosensitive material and formed on the first surface of the carrier board, with an opening in the first dielectric layer to expose the non-active surface of the semiconductor chip for heat dissipation, wherein the first dielectric layer is formed without any circuit layer;
    a second dielectric layer made of a photosensitive material and formed on the second surface of the carrier board and the active surface of the semiconductor chip, wherein a plurality of openings are formed in the second dielectric layer for exposing the electrode pads on the semiconductor chip; and
    a circuit layer formed on the second dielectric layer and electrically connected to the electrode pads on the semiconductor chip via the conductive structures in the second dielectric layer.

2. The circuit board structure with an embedded semiconductor chip of claim 1, wherein the carrier board is one of an insulating board, a metallic board, and a circuit board.

3. The circuit board structure with an embedded semiconductor chip of claim 1, wherein the first dielectric layer and the second dielectric layer are made of the same material.

4. The circuit board structure with an embedded semiconductor chip of claim 1 further comprising a circuit build up structure formed on the second dielectric layer and the circuit layer.

5. The circuit board structure with an embedded semiconductor chip of claim 4, wherein the first dielectric layers increase with the circuit build up layers, thus eliminating warpage which might otherwise arise from unbalanced stress due to temperature variation and an increased number of circuit build up layers.

6. The circuit board structure with an embedded semiconductor chip of claim 4, wherein the circuit build up structure comprises a dielectric layer, a circuit layer stacked on the dielectric layer, and conductive structures formed in the dielectric layer for electrical connection with the circuit layer.

7. The circuit board structure with an embedded semiconductor chip of claim 6, wherein a plurality of electrical connection pads are formed on the outer surface of the circuit build up structure.

8. The circuit board structure with an embedded semiconductor chip of claim 7, further comprising a solder mask layer formed on the outer surface of the circuit build up structure and formed with a plurality of openings for exposing the electrical connection pads.

9. The circuit board structure with an embedded semiconductor chip of claim 8, further comprising conductive elements formed on the electrical connection pads in the openings of the solder mask layer.

10. The circuit board structure with an embedded semiconductor chip of claim 9, wherein each of the conductive elements is one of a solder ball, a pin, and a metal land.

11. The circuit board structure with an embedded semiconductor chip of claim 1, wherein the carrier board comprises at least two core layers interposed with an adhesive layer, the core layers being pressed to allow the adhesive layer to fill the gap between the semiconductor chip and the through hole of the carrier board such that the semiconductor chip is secured in position.

* * * * *